(12) United States Patent
Nagao (10) Patent No.: US 7,351,643 B2
(45) Date of Patent: Apr. 1, 2008

(54) METHOD OF MANUFACTURING A SEMICONDUCTOR DEVICE

(75) Inventor: Takeshi Nagao, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 184 days.

(21) Appl. No.: 11/370,892

(22) Filed: Mar. 9, 2006

(65) Prior Publication Data

US 2006/0211214 A1 Sep. 21, 2006

(30) Foreign Application Priority Data

Mar. 16, 2005 (JP) .............................. 2005-074657

(51) Int. Cl.
- *H01L 21/76* (2006.01)
- *H01L 21/461* (2006.01)
- *H01L 21/302* (2006.01)

(52) U.S. Cl. ...................... 438/424; 438/706; 438/689; 438/690; 257/E21.252; 257/E21.275; 257/E21.279

(58) Field of Classification Search ................ 438/424, 438/689, 690, 706; 257/E21.252, E21.275, 257/E21.279

See application file for complete search history.

(56) References Cited

U.S. PATENT DOCUMENTS

| 6,878,612 B2* | 4/2005 | Nagao et al. ................ 438/586 |
| 7,169,682 B2* | 1/2007 | Hirohama et al. ........... 438/424 |
| 2002/0030174 A1 | 3/2002 | Yamada et al. |
| 2005/0170607 A1* | 8/2005 | Hirohama et al. ........... 438/424 |

FOREIGN PATENT DOCUMENTS

| EP | 0 536 968 A2 | 4/1993 |
| JP | 05-102107 | 4/1993 |
| JP | 06-283460 | 10/1994 |
| JP | 2001-127039 | 5/2001 |

\* cited by examiner

*Primary Examiner*—Michael Lebentritt
*Assistant Examiner*—Mohsen Ahmadi
(74) *Attorney, Agent, or Firm*—Volentine & Whitt, P.L.L.C.

(57) ABSTRACT

Even though photolithography with a diameter of 0.20 μm or less is employed, a contact hole having a tapered shape with a required width including a positioning tolerance can be formed in a narrower gap between the gate electrodes. A method forms a minute contact hole between gate electrodes of a semiconductor device, which has a silicon dioxide film disposed at an upper layer of the semiconductor device and a BPSG film disposed below the silicon dioxide film. The BPSG film has gate electrodes therein, and no silicon nitride film is disposed on top and side surfaces of the gate electrodes, and no silicon nitride film is disposed above the gate electrodes. The silicon dioxide film is etched by a mixed gas of $CF_4$, $O_2$ and Ar at a substrate temperature of at least 40° C. The BPSG film is etched by over-etching of the silicon dioxide film so that a W-like shape is formed in the BPSG film. Subsequently the BPSG film is etched by a mixed gas of $C_4F_8$, $CH_2F_2$ and Ar without including CO gas and $O_2$ gas so that the contact hole between the adjacent gate electrodes has a forward tapered shape with a tapered angle of less than 90 degree.

20 Claims, 5 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device and more particularly to a method of forming a contact hole connecting to a silicon film of a semiconductor device having a structure of an erasable programmable read-only memory (EPROM).

2. Description of the Related Art

A self-alignment contact (SAC) etching technology has been used in order to create a minute contact hole and to provide a margin for an alignment of the photolithography process in the above-mentioned semiconductor device (refer to, for example, Japanese Patent Kokai No. 2001-127039). According to this technology, during a contact formation process, a gate electrode is covered with a nitride film so that the nitride film serves as a stopper film.

On the other hand, a dry etching method for the semiconductor device is known, in which a contact hole is formed to penetrate insulation films consisting of a non-doped silicate glass (NSG) film and a boron phosphorus silicate glass (BPSG) film laminated on a silicon substrate, and then a damaged layer of the silicon substrate at the bottom of the contact hole and a coated film on an inner wall of the contact hole are removed while preventing the insulation films of the laminated structure from side-etching. According to this method, by applying high-frequency power to a mixed gas of oxygen and carbon fluoride, it is possible to remove the damaged layer and the coated film and accurately form a contact hole having a smoothly tapered inner wall with no stepped section (refer to, for example, Japanese Patent Kokai No. 6-283460).

Further, another dry etching technique is known using a dry etching apparatus of a narrow gap system, in which a mixed gas of $CF_4$, $CHF_3$ and Ar is used as a dry etching gas for etching an interlayer insulation film (refer to, for example, Japanese Patent Kokai No. 5-102107). This technique forms a minute and deep contact hole having a tapered slope, viewed in cross section, with an aspect ratio greater than 1, by forming a protection film on a side surface of the contact hole.

The above-mentioned etching process described in Japanese Patent Kokai No. 2001-127039, i.e., the process using the SAC technique in which the gate electrode is covered with the nitride film so that the nitride film serves as a stopper film, requires the process to cover the gate electrode with the nitride film. Accordingly, the etching process has a problem in that physical-chemical properties of the gate electrode may change and that adjustment of an electrical characteristic, such as resistance or capacitance, may be difficult.

When it is impossible to cover the nitride film, a forward tapered slope is generally formed, which however may cause a problem when the lithography size is less than about 0.20 µm. For example, in the case of a reactive ion etching (RIE) employing a mixed gas of $CHF_3$ and CO, the contact hole may have a so-called bow shape, i.e., a barrel shape, or the etching does not proceed when the contact hole reaches a certain depth due to deposition of a reaction product on the bottom. On the other hand, in the case of a mixed gas including CO and $O_2$, the contact hole may easily provide a vertical slope, which may unfavorably connect to the gate electrode. Furthermore, in the case of patterning a large area, the silicon substrate may have a roughly etched situation, which decreases accuracy of the alignment for the photolithography and decreases the measurement accuracy for an alignment.

The above-mentioned dry etching method described in Japanese Patent Kokai No. 6-283460, which forms the contact hole to penetrate the insulation films of the NSG film and the BPSG film laminated on the silicon substrate, uses a mixed gas of oxygen and carbon fluoride as well as oxygen gas in order to remove the damaged layer and the coated film generated during the formation of the contact hole mentioned above. Accordingly, there is a problem in that a surface of the silicon substrate has a roughly etched condition, which decreases accuracy of the alignment for photolithography and decreases measurement accuracy for the alignment.

The above-mentioned dry etching method described in Japanese Patent Kokai No. 5-102107 creates the protection film on the side face of the contact hole, and therefore a process to remove the protection film on the side face of the contact hole is necessary after the etching process. Accordingly, there is a problem in that operation of the method is complicated, and that the surface of the silicon substrate is damaged, thereby decreasing the accuracy.

SUMMARY OF THE INVENTION

In consideration of the circumstance described above, an object of the present invention is to provide a method of manufacturing a semiconductor device which can form a contact hole with a tapered shape having a required space within a narrower gap between the gate electrodes taking into account an alignment tolerance, even when the photolithography with a diameter of 0.20 µm or less is employed.

In order to solve the above-mentioned problem, the present invention includes the following features with respect to a method of manufacturing a semiconductor device and more particularly to a method of forming a contact hole for a semiconductor device having an EPROM structure.

According to a first aspect of the present invention, there is provided a method of fabricating a semiconductor device having a silicon dioxide film disposed at an upper layer of the semiconductor device and a BPSG film disposed below the silicon dioxide film, the BPSG film having gate electrodes therein. No silicon nitride film is disposed on top and side surfaces of the gate electrodes and no silicon nitride film is disposed above the gate electrodes. The method includes formation of a contact hole between adjacent gate electrodes, and the contact hole formation method includes the steps of etching the silicon dioxide film by a mixed gas of $CF_4$, $O_2$ and Ar at a substrate temperature of at least 40° C. using a resist mask layer for forming the contact hole, and etching the BPSG film by over-etching of the silicon dioxide film so that a W-like shape, viewed in cross section, is formed in the BPSG film, and subsequently etching the BPSG film by a mixed gas of $C_4F_8$, $CH_2F_2$ and Ar without including CO gas and $O_2$ gas so that the contact hole between the adjacent gate electrodes has a forward tapered shape with a tapered angle of less than 90 degree.

As described above, according to the first aspect of the present invention, the etching mask is applied in such a manner that the upper NSG film is etched, the BPSG film is etched by over-etching of the upper NSG film to have the W-like shape, and the BPSG film is subsequently etched. This makes it possible to let the W-like shape create a hole with a tapered shape during etching of the BPSG film.

In this instance, increase of the film thickness of the NSG film for a prolonged etching operation makes it possible to create the W-like shape with a steeper tapered angle. Accordingly, this embodiment can apply to the gate electrodes having a narrower gap therebetween. It should be noted that a similar effect as mentioned above can be obtained by decreasing the opening diameter of the photolithography.

Further, since neither CO gas nor $O_2$ gas is used in etching the BPSG film, a deposition effect can be enhanced, which easily provides the tapered shape.

Moreover, since no silicon nitride film is formed on top and side surfaces of the gate electrode and no silicon nitride film is formed above the gate electrode, it is possible to achieve an effect in which electrical characteristics of the gate electrode are not affected.

According to a second aspect of the present invention, there is provided a method of fabricating a semiconductor device having a silicon dioxide film disposed at an upper layer of the semiconductor device, a BPSG film disposed below the silicon dioxide film, and a silicon nitride film disposed below the BPSG film but no silicon nitride film being disposed on top and side surfaces of the gate electrodes and no silicon nitride film being disposed above the gate electrodes. The BPSG film has gate electrodes therein. The method includes providing an organic film on the silicon dioxide film and forming a contact hole between adjacent gate electrodes, and the contact hole formation method includes the steps of forming a mask pattern with a maximum opening of 0.20 μm in a resist mask applied on the organic film, etching the organic. film and the silicon dioxide film by a mixed gas of $CF_4$, $O_2$ and Ar at a substrate temperature of at least 40° C., and etching the BPSG film by over-etching of the silicon dioxide film so that a W-like shape is formed in the BPSG film, subsequently etching the BPSG film by a mixed gas of $C_4F_8$, $CH_2F_2$ and Ar without including a CO gas and an $O_2$ gas so that the contact hole between the adjacent gate electrodes has a forward tapered shape with a tapered angle of 85 degree, and subsequently etching the silicon nitride film by over-etching of the BPSG film.

As described above, according to the second aspect of the present invention, the etching mask is applied in such a manner that the contact hole of the BPSG film, which is etched by over-etching of the organic film, i.e., the upper antireflective coating (BARC film) and the NSG film, is formed to have a W-like shape with a deeper circular groove, i.e., two deeper side troughs with one higher peak therebetween viewed in cross section, at the bottom of the hole as compared with the first embodiment, and the BPSG film 3 is subsequently etched. Accordingly, a tapered shape with the required space can be obtained within a gap between the adjacent gate electrodes taking into account the alignment tolerance even when a photolithography diameter of about 0.20 μm is employed.

According to a third aspect of the present invention, there is provided a method of fabricating a semiconductor device having a silicon dioxide film disposed at an upper layer of the semiconductor device, a BPSG film disposed below the silicon dioxide film, and a silicon nitride film disposed below the BPSG film but no silicon nitride film being disposed on top and side surfaces of the gate electrodes and no silicon nitride film being disposed above the gate electrodes, the BPSG film having gate electrodes therein. The method includes formation of a contact hole between adjacent gate electrodes. The contact hole formation method includes a step to etch the silicon nitride film through the contact hole by using a mixed gas of $C_4F_8$, $CH_2F_2$ and Ar as an etching gas. A gas composition ratio of ($C_4F_8$ gas content)/($CH_2F_2$ gas content) of the etching gas is less than 1 on a gas volume basis. A resist mask has a first opening for the contact hole with a maximum opening of 0.2 μm and a second opening for an alignment mark of photolithography formed on an upper layer or for measurement of the alignment with a minimum opening of 0.25 μm so that etching through the second opening is stopped at the silicon nitride film when the contact hole is opened for connection.

As described above, according to the third aspect of the present invention, the pattern used for the alignment or for the measurement of the alignment is designed to have an opening so that etching is stopped at the silicon nitride film disposed below the gate electrode during the formation of the contact hole. Accordingly, the silicon substrate is not damaged, and it is expected that accuracy to determine the photolithography alignment or the measurement for an alignment during and after the contact formation step is improved.

A composition ratio of the mixed gas of $CF_4$, $O_2$ and Ar used for etching the silicon dioxide film of the present invention may preferably be $CF_4$:$O_2$:Ar=3:1:8 on a gas volume basis. For etching the silicon dioxide film, a CF gas is a requisite component, and an Ar gas content of more than about half of the total gas volume is necessary to sustain stable plasma in the etching apparatus. Accordingly, a value obtained from the formula (CF4 gas content+O2 gas content)/(Ar gas content) of the mixed gas of $CF_4$, $O_2$ and Ar on a gas volume basis may preferably be in a range of from 6/6 to 2/10. Further, a value obtained from the formula (CF4 gas content)/(O2 gas content) of the mixed gas of $CF_4$, $O_2$ and Ar on a gas volume basis may preferably be in a range of from 3.5/0.5 to 1/3.

A temperature of the substrate to be heated during the etching of the present invention may preferably range from 40° C. to 80° C. A substrate temperature below 40° C. may not be preferable because no etching process occurs, whereas a substrate temperature above 80° C. may not be preferable because the resist mask may be burned and become useless.

A gas composition ratio of the mixed gas of $C_4F_8$, $CH_2F_2$ and Ar used for etching the BPSG oxide film of the present invention may preferably be $C_4F_8$:$CH_2F_2$:Ar=7:4:500 on a gas volume basis. A value of the formula (Ar gas flow rate)/(total gas flow rate) of the mixed gas of $C_4F_8$, $CH_2F_2$ and Ar on a gas volume basis may preferably be in a range of from 96.7% to 98.0%. Further, a value obtained from the formula ($C_4F_8$ gas content)/($CH_2F_2$ gas content) of the mixed gas of $C_4F_8$, $CH_2F_2$ and Ar on a gas volume basis may preferably be more than 0 and no more than 1, and a value obtained from the formula ($C_4F_8$ gas content+$CH_2F_2$ gas content)/(total gas flow rate) of the mixed gas of $C_4F_8$, $CH_2F_2$ and Ar on a gas volume basis may preferably be not less than 10/512 and not more than 17/512.

An organic film, i.e., a bottom antireflective coating (BARC) film, of the present invention is provided only for forming the resist pattern. This film is removed together with the resist after forming the pattern. Any material including carbon, nitrogen, hydrogen, and oxygen may be used for the BARC film. The BARC film may alternatively be formed by directly forming a carbon thin film using vapor deposition or sputtering.

DETAILED DESCRIPTION OF THE INVENTION

Embodiments of a manufacturing method of a semiconductor device of the present invention will be hereinafter described with reference to the accompanying drawings.

First Embodiment

Figure 1:
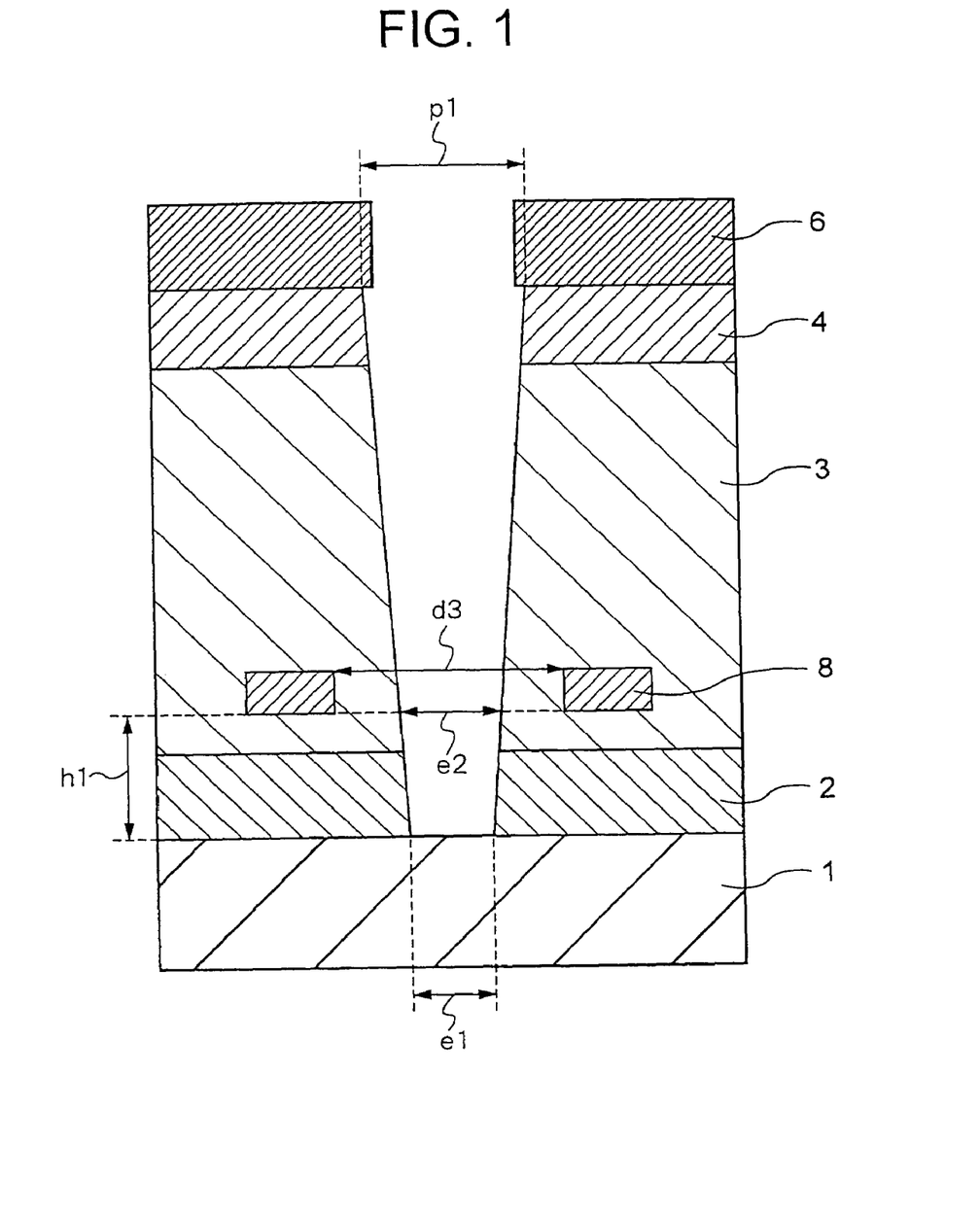
FIG. 1 is a cross sectional view showing a first embodiment of the present invention.

Referring to FIG. 1, an NSG film 2 (silicon dioxide film) is formed on a silicon substrate 1 to have a film thickness of 100 nm or more. Gate electrodes 8 are formed above the silicon substrate 1 so that a distance between a bottom surface of the gate electrodes 8 and a top surface of the silicon substrate 1 (shown as h1 in FIG. 1) is 250 nm. In this instance, the gate electrodes 8 are formed by a lithography technique so that adjacent gate electrodes 8 are spaced apart by a 0.28 μm gap (shown as d3 in FIG. 1). Subsequently, a BPSG film 3 is formed on the NSG film 2 to have a film thickness of 450 nm. On the BPSG film 3, an NSG film 4 (silicon dioxide film) is formed to have a film thickness of 100 nm. It should be noted that the gate electrodes 8 may be positioned either directly on the NSG film 2 or within a lower part of the BPSG film 3 as shown in FIG. 1 as long as the gate electrodes 8 are positioned higher than the NSG film 2.

On this laminated structure, a resist mask layer 6 with a layer thickness of 0.15 μm is formed so that a contact hole having a forward tapered shape, as shown in FIG. 1, is formed through the 0.28 μm gap (shown as d3 in FIG. 1) between the adjacent gate electrodes 8, by way of steps described below.

In the above-described structure, no silicon nitride film is formed after forming the gate electrode 8.

In a dry-etching apparatus of a reaction ion etching (RIE) method, the NSG film 4 is etched by a mixed gas of $CF_4$, $O_2$ and Ar using the resist mask layer 6 as an etching mask. In the first embodiment, a mixing ratio of $CF_4$, $O_2$ and Ar in the mixed gas used for etching the silicon dioxide film is $CF_4:O_2:Ar=3:1:8$ on a gas volume basis.

Other etching conditions are 0.060 Torr in pressure, 1400 W in biased power, 60 sccm in $CF_4$ gas flow rate, 20 sccm in $O_2$ gas flow rate, 160 sccm in Ar gas flow rate, and substrate temperature of 40°.

Figure 2:
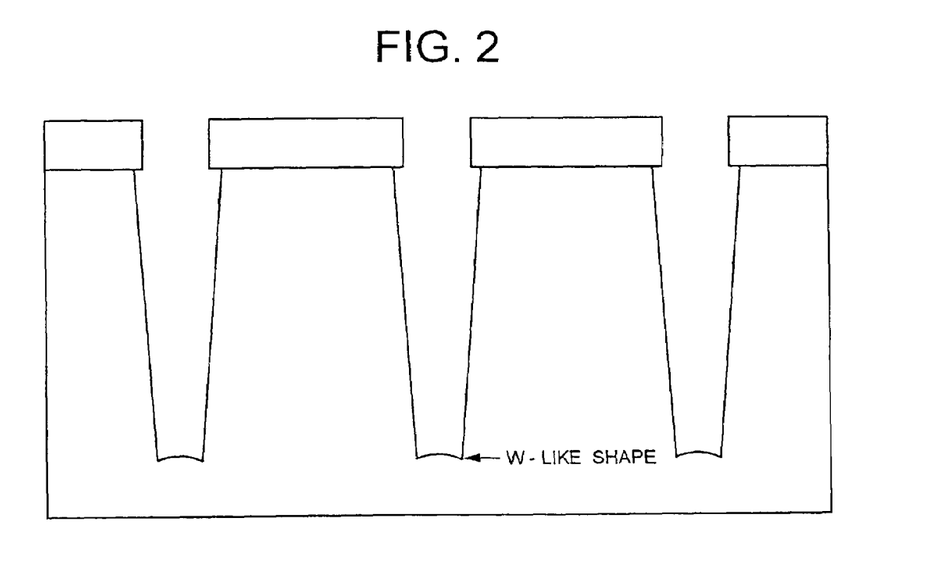
FIG. 2 is a drawing showing a shape of a contact formed in a BPSG film by over-etching according to an embodiment of the present invention.

As a result, etching rate at a circumference of a bottom of a contact hole formed in the NSG film 4 is about 10% faster than that at a central part thereof. Consequently, the bottom of the contact hole positioned in the BPSG film 3 has a circular groove, i.e., a W-like shape viewed in cross section as shown in FIG. 2, in the case of over-etching of the NSG film 4.

Subsequently, the BPSG film 3 and the NSG film 2 are etched by using a mixed gas of $C_4F_8$, $CH_2F_2$ and Ar. A mixing ratio of $C_4F_8$, $CH_2F_2$ and Ar in the mixed gas used for etching the BPSG film 3 and the NSG film 2 is $C_4F_8:CH_2F_2:Ar=7:4:500$ on a gas volume basis. It should be noted that a CO gas and an $O_2$ gas are not added to this mixed gas.

Other etching conditions are 0.025 Torr in pressure, 1700 W in biased power, 7 sccm in $C_4F_8$ gas flow rate, 4 sccm in $CH_2F_2$ gas flow rate, 500 sccm in Ar gas flow rate, and substrate temperature of 40°.

Figure 3:
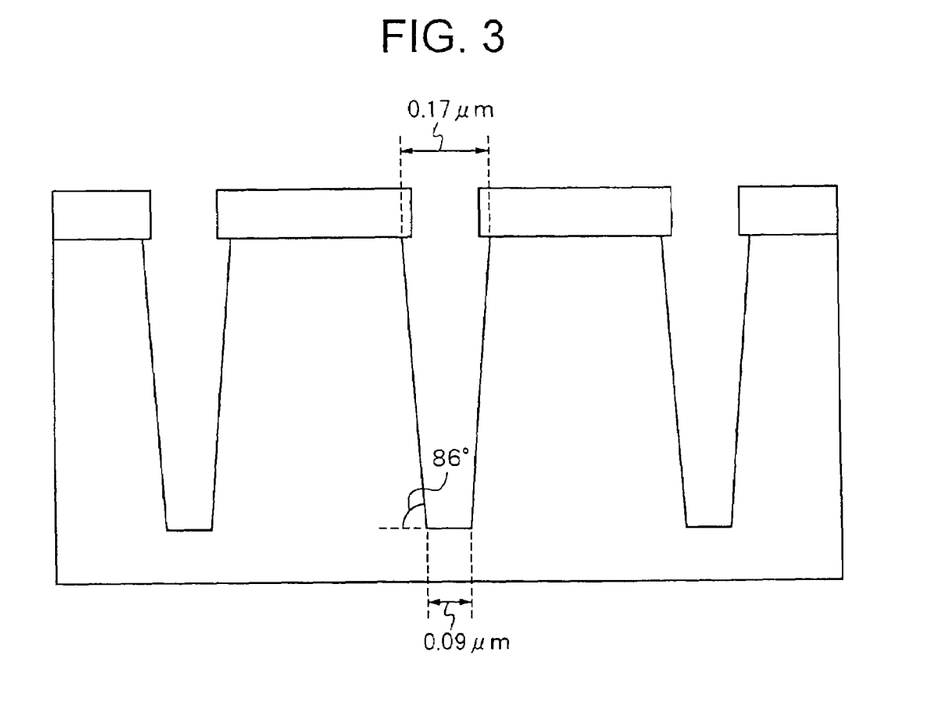
FIG. 3 is a drawing showing a dimension of a contact formed by the first embodiment of the present invention.

As a result, a contact hole is formed to have, as shown by a cross sectional view in FIG. 3, a 0.17 μm diameter at the top of the hole (shown as p1 in FIG. 1), a 0.09 μm diameter at the bottom of the hole (shown as e1 in FIG. 1), and a forward tapered slope with a tapered angle of about 86 degree.

As described above, according to the first embodiment, the etching mask is applied in such a manner that the upper NSG film 4 is etched, the BPSG film 3 is etched by the over-etching of the upper NSG film 4 to have the W-like shape in cross section, and the BPSG film 3 is subsequently etched. This makes it possible to let the W-like shape create a hole with a tapered shape during etching of the BPSG film 3.

In this instance, increase of the film thickness of the NSG film 2 for a prolonged etching operation makes it possible to create the W-like shape with a steeper tapered angle. Accordingly, this embodiment can apply to the gate electrodes having a narrower gap therebetween. It should be noted that a similar effect as mentioned above can be obtained by decreasing the opening diameter of the photolithography.

Further, since neither CO gas nor $O_2$ gas is used in etching the BPSG film 3, a deposition effect can be enhanced, which easily provides the tapered shape.

Moreover, since no silicon nitride film is formed on a top surface and side surfaces of the gate electrode 8 and no silicon nitride film is formed above the gate electrode 8, it is possible to achieve an effect that electrical characteristics of the gate electrode 8 are not affected.

Second Embodiment

Figure 4:
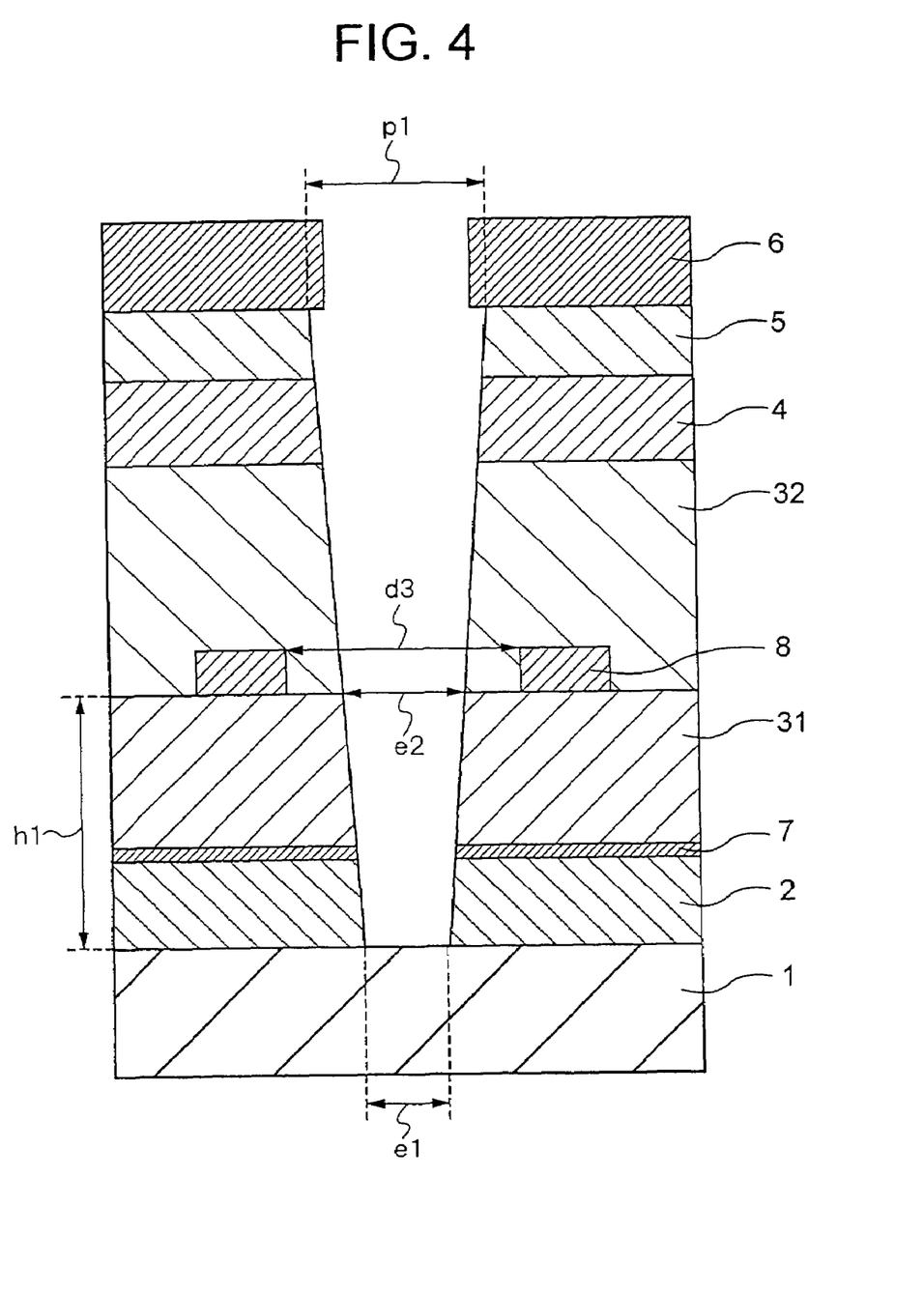
FIG. 4 is a cross sectional view showing a second embodiment of the present invention.

Referring to FIG. 4, a cross sectional view of a second embodiment according to the present invention is illustrated, in which an NSG film 2 (silicon dioxide film) is formed on a silicon substrate 1 to have a film thickness of 100 nm. A silicon nitride film 7 is formed on the NSG film 2 to have a film thickness of 15 nm. A BPSG film 31 is formed on the silicon nitride film 7 so that a distance between a top surface of the BPSG film 31 and a top surface of the silicon substrate 1 (shown as h1 in FIG. 4) is 250 nm. On the BPSG film 31, gate electrodes 8 are formed by a lithography technique so that adjacent gate electrodes are spaced apart by a 0.14 μm gap (shown as d3 in FIG. 4). Further, on the gate electrodes 8, a BPSG film 32 is formed to have a film thickness of about 300 nm. The BPSG film 32 and the BPSG film 31 together provide a combined film thickness of about 450 nm. On the BPSG film 32, an NSG film 4 (silicon dioxide film) is formed to have a film thickness of 100 nm.

Since the silicon nitride film 7 is disposed below the gate electrodes 8 in this structure, electrical characteristics of the gate electrodes 8 formed after the silicon nitride film 7 are not affected.

On this laminated structure, a resist mask layer 6 with a layer thickness of about 0.15 μm is formed. Accordingly, a contact hole having a forward tapered shape with a bottom diameter of about 0.1 μm is formed through the 0.14 μm gap (shown as d3 in FIG. 4) between the adjacent gate electrodes 8 by way of steps described below. In order to form the resist mask layer 6 with a layer thickness of 0.15 μm, a bottom antireflective coating (BARC) film 5 as an organic film is formed in advance between the resist mask layer 6 and the NSG film 4 to have a film thickness of 80 nm.

In a dry-etching apparatus applying a reaction ion etching (RIE) method, the BARC film 5 and the NSG film 4 are consecutively etched by a mixed gas of $CF_4$, $O_2$ and Ar using the resist mask layer 6 as an etching mask. A mixing ratio of $CF_4$, $O_2$ and Ar in the mixed gas used for etching the silicon dioxide film is, as similar to the first embodiment, $CF_4:O_2:Ar=3:1:8$ on a gas volume basis. It should be noted that other etching conditions remain unchanged from those of the first embodiment.

As a result, etching rate at a circumference of a bottom of a contact hole in the NSG film 4 is about 10% faster than that at a central part thereof. Consequently, the bottom of the contact hole positioned in the BPSG film 32 has a circular groove, i.e., a W-like shape viewed in cross section as shown in FIG. 2, in the case of over-etching of the NSG film 4.

Subsequently, the BPSG film 31 and the NSG film 2 are etched by using a mixed gas of $C_4F_8$, $CH_2F_2$ and Ar. A mixing ratio of $C_4F_8$, $CH_2F_2$ and Ar in the mixed gas used for etching the BPSG film 31 and the NSG film 2 is $C_4F_8:CH_2F_2:Ar=4:8:500$ on a gas volume basis. It should be noted that a CO gas and an $O_2$ gas are not added into this mixed gas.

As compared with the etching conditions of the first embodiment, the $CH_2F_2$ gas flow rate is increased to 8 sccm so as to be higher than the $C_4F_8$ gas flow rate.

Figure 5A:
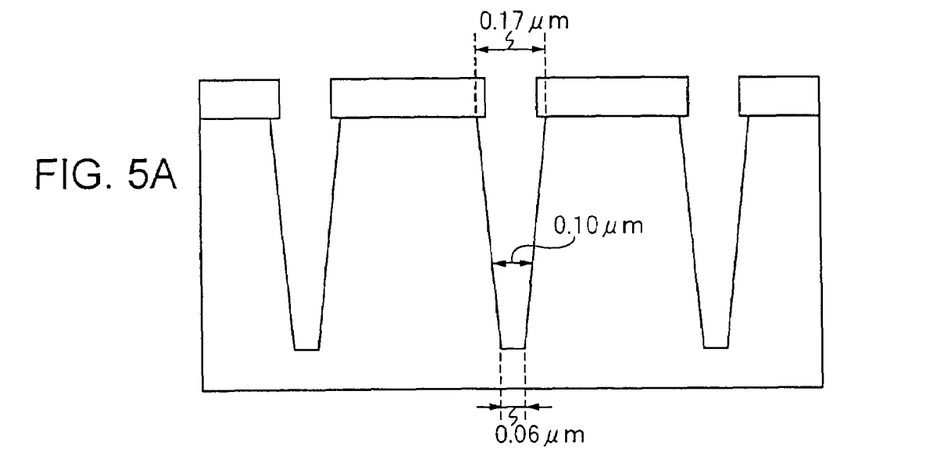
FIGS. 5A to 5C are drawings showing dimensions of contacts formed by the second embodiment of the present invention.
Figure 5B:
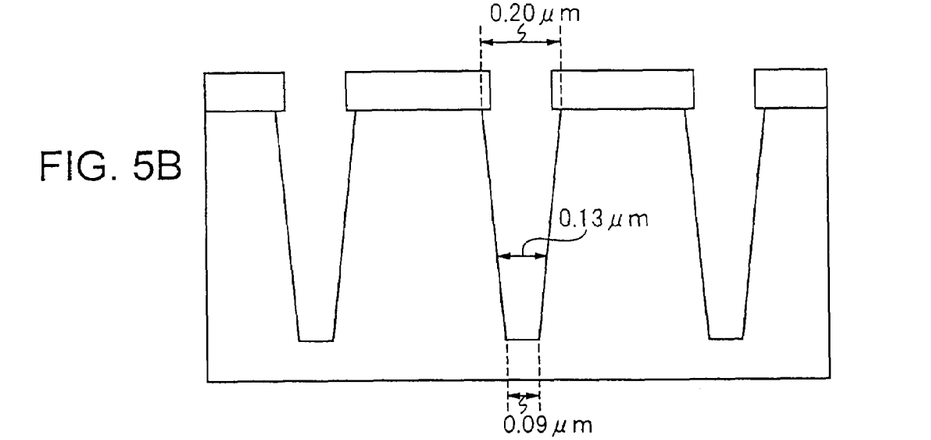
Figure 5C:
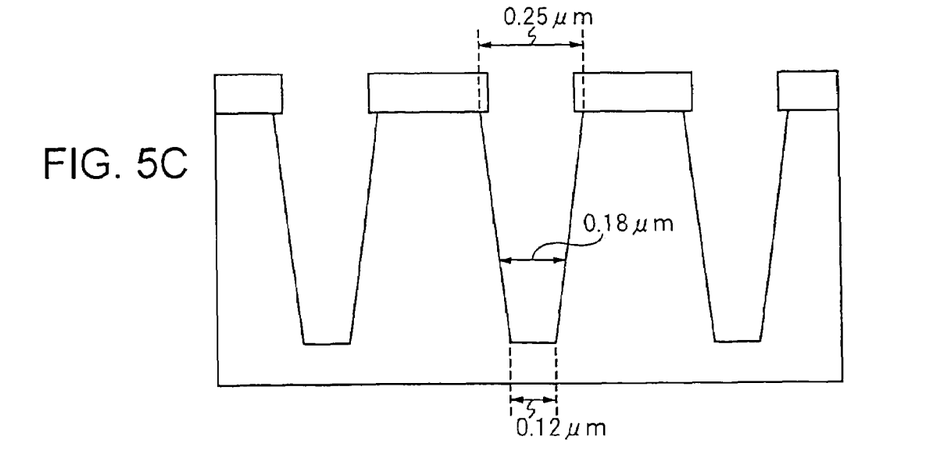

As a result, as shown by cross sectional views in FIGS. 5A to 5C, a contact hole is formed to have (A) a 0.06 μm diameter at the bottom of the hole (shown as e1 in FIG. 4) and a forward tapered angle of about 85 degree when a diameter at the top of the hole is 0.17 μm (shown as p1 in FIG. 4), (B) a 0.09 μm diameter at the bottom of the hole and a forward tapered angle of 85 degree when a diameter at the top of the hole is 0.20 μm, or (C) a 0.12 μm diameter at the bottom of the hole and a forward tapered angle of 84 degree when a diameter at the top of the hole is 0.25 μm. Furthermore, as shown in FIGS. 5A to 5C, contact hole diameters at a depth equal to a level of the top surface of the BPSG film 31 having the gate electrodes 8 thereon (shown as e2 in FIG. 4) are respectively 0.10, 0.13 and 0.18 μm, which not only provides a required space but also satisfy the maximum space in the gap between the adjacent gate electrodes 8, i.e., 0.18 μm taking into account the alignment tolerance.

As described above, according to the second embodiment, the etching mask is applied in such a manner that the contact hole of the BPSG film 32 is etched by over-etching of the upper antireflective coating (BARC film) 5 as the organic film and the NSG film 4, the bottom of the BPSG film 32 is formed to have the W-like shape with the deeper circular groove, i.e., two deeper side troughs with one higher peak therebetween viewed in cross section, at the bottom of the hole as compared with the first embodiment, and the BPSG film 3 is subsequently etched. Accordingly, a tapered shape with the required space can be obtained between the adjacent gate electrodes taking into account the alignment tolerance even when a photolithography diameter of about 0.20 μm is employed.

Further, since the $CH_2F_2$ gas flow rate that decrease the etching selectivity towards the silicon nitride film is increased, an effect is obtained in which a contact hole with a continuously tapered shape can be formed without stopping the etching at the silicon nitride film 7 disposed below the gate electrode 8.

Third Embodiment

A third embodiment will be hereinafter described.

By changing the $CH_2F_2$ gas flow rate to a certain value in the second embodiment, under a certain photolithography opening diameter, the silicon nitride film 7 can be either etched in a short time period or not etched, i.e., the etching stops.

The etching selectivity towards the silicon nitride film is decreased when the etching conditions of the BPSG film 31 is changed from that of the second embodiment to either increase the $CH_2F_2$ gas flow rate, decrease the $C_4F_8$ gas flow rate, increase the vacuum level, or increase the biased power. On the other hand, when the photolithography opening diameter is decreased, the etching selectivity towards the silicon nitride film is decreased.

By applying these cases, a hole not to be connected to the silicon substrate, e.g., the pattern used for an alignment of photolithography or for measurement of the alignment, is made to provide a diameter larger than that of the contact hole so that the silicon nitride film 7 disposed below the gate electrodes 8 is not etched. Accordingly, a contact hole with a required minute diameter can be self-selectively obtained.

Figure 6A:
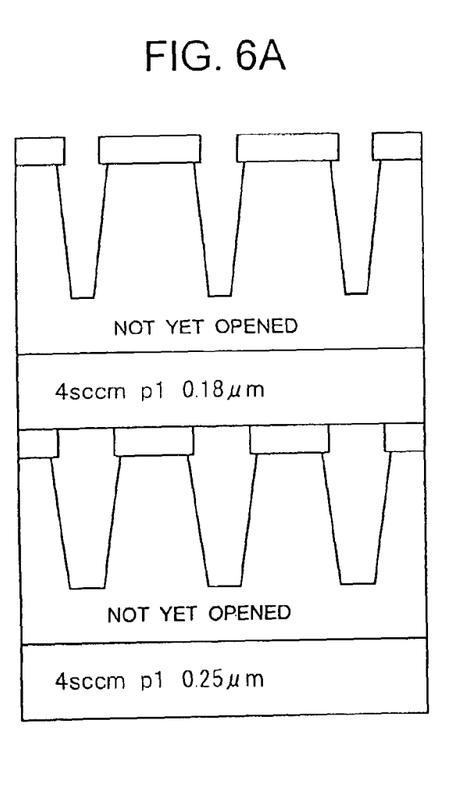
FIGS. 6A to 6C are drawings showing dimensions of contacts formed by the third embodiment of the present invention.
Figure 6B:
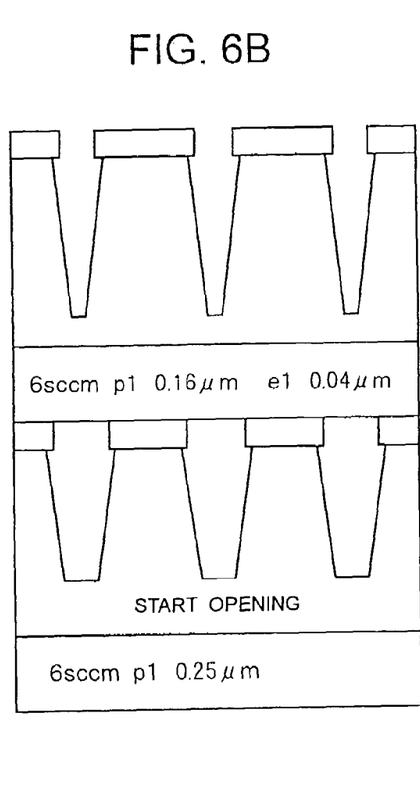
Figure 6C:
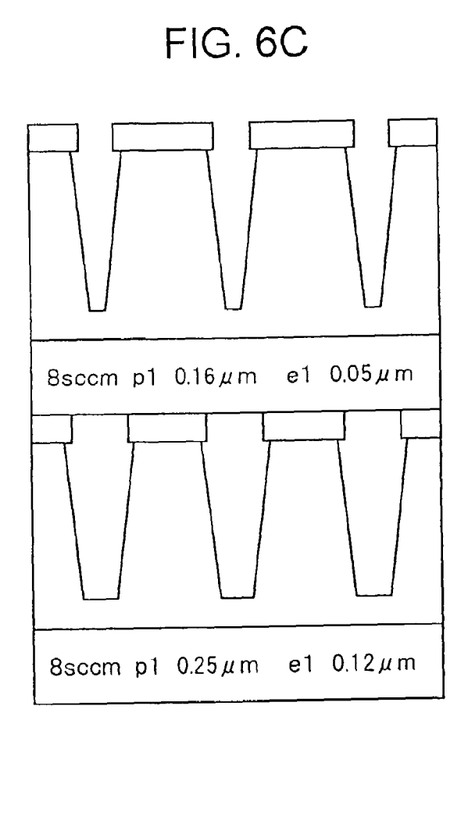

The etched situation of the silicon nitride film 7 when the $CH_2F_2$ gas flow rate is varied to 4 sccm, 6 sccm and 8 sccm are shown in FIGS. 6A to 6C. As shown in FIG. 6A, when the $CH_2F_2$ gas flow rate is low at 4 sccm, the etching selectively is high in the holes with the top opening diameter (p1) of 0.25 μm and 0.18 μm, and thus no opening is formed by two minutes etching. As shown in FIG. 6B, when the $CH_2F_2$ gas flow rate is medium at 6 sccm, an opening is formed in two minutes in the hole with the top opening diameter (p1) of less than 0.18 μm, i.e., 0.16 μm, whereas no opening is formed in the hole with the top opening diameter (p1) of 0.25 μm. As shown in FIG. 6C, when the $CH_2F_2$ gas flow rate is high at 8 sccm, an opening is formed in two minutes in the holes with the top opening diameter (p1) ranging from 0.16 μm to 0.25 μm.

Accordingly, decrease in etching selectivity towards the silicon nitride film 7 allows increasing the diameter of the contact hole.

It is now assumed that etching is carried out to form a contact hole with a 0.18 μm diameter or less connecting to the substrate, and an alignment mark has a slit shape with a width of 0.25 μm or more. In this instance, etching through the alignment mark can be stopped at the silicon nitride film 7 disposed below the gate electrode by controlling the $CH_2F_2$ gas flow rate at 6 sccm with other etching conditions remain unchanged from the second embodiment.

It should be noted that "not yet opened" shown in FIG. 6A denotes an etching result in which either the etching rate of the silicon nitride was extremely slow or no etching occurred.

The etching selectivity towards the silicon nitride film is defined as the etched-away quantity of the silicon dioxide film (BPSG or NSG) divided by that of the silicon nitride film. Accordingly, the smaller the etched-away quantity of the silicon nitride film is, the bigger the etching selectivity towards the silicon nitride film.

As described above, according to the third embodiment, the pattern used for the alignment or for the measurement of the alignment is designed to have a diameter so that etching is stopped at the silicon nitride film disposed below the gate electrode during the formation of the contact hole. Accordingly, the silicon substrate is not damaged, and therefore it is expected that accuracy to determine the photolithography alignment or the measurement for an alignment during and after the contact formation step is improved.

Although the present invention has been heretofore described with reference to the embodiments, it should be noted that the present invention is not limited to the embodiments, and several variations and modifications are fall within the scope of the present invention and equivalent thereof.

The present invention is based on Japanese Patent Application No. 2005-074657 which is hereby incorporated by reference in its entirety.

What is claimed is:

1. A method of fabricating a semiconductor device having a silicon dioxide film disposed at an upper layer of the semiconductor device and a BPSG film disposed below the silicon dioxide film, the BPSG film having gate electrodes therein, and no silicon nitride film being disposed on top and side surfaces of the gate electrodes and no silicon nitride film being disposed above the gate electrodes, the method including formation of a contact hole between adjacent gate electrodes, the contact hole formation method comprising the steps of:

etching the silicon dioxide film by a mixed gas of $CF_4$, $O_2$ and Ar at a substrate temperature of at least 40° C. using a resist mask layer for forming the contact hole, and etching the BPSG film by over-etching of the silicon dioxide film so that a W-like shape is formed in the BPSG film; and subsequently etching the BPSG film by a mixed gas of $C_4F_8$, $CH_2F_2$ and Ar without including CO gas and $O_2$ gas so that the contact hole between the adjacent gate electrodes has a forward tapered shape with a tapered angle of less than 90 degree.

2. The method according to claim 1, wherein the mixed gas of $CF_4$, $O_2$ and Ar has a composition ratio of $CF_4$:$O_2$:Ar=3:1:8 on a gas volume basis.

3. The method according to claim 1, wherein a value obtained from a formula of (CF4 gas content+O2 gas content)/(Ar gas content) of the mixed gas of $CF_4$, $O_2$ and Ar on a gas volume basis is in a range of from 6/6 to 2/10.

4. The method according to claim 1, wherein a value obtained from a formula of (CF4 gas content)/(O2 gas content) of the mixed gas of $CF_4$, $O_2$ and Ar on a gas volume basis is in a range of from 3.5/0.5 to 1/3.

5. The method according to claim 1, wherein the substrate temperature during the etching of the silicon dioxide film is in a range from 40° C. to 80° C.

6. The method according to claim 1, wherein the mixed gas of $C_4F_8$, $CH_2F_2$ and Ar has a gas composition ratio of $C_4F_8$:$CH_2F_2$:Ar=7:4:500 on a gas volume basis.

7. The method according to claim 1, wherein a value obtained from a formula of (Ar gas flow rate)/(total gas flow rate)×100 of the mixed gas of $C_4F_8$, $CH_2F_2$ and Ar on a gas volume basis is in a range of from 96.7% to 98.0%.

8. The method according to claim 1, wherein a value obtained from a formula of ($C_4F_8$ gas content)/($CH_2F_2$ gas content) of the mixed gas of $C_4F_8$, $CH_2F_2$ and Ar on a gas volume basis is greater than 0 and not more than 1, and a value obtained from a formula of ($C_4F_8$ gas content+$CH_2F_2$ gas content)/(total gas flow rate) of the mixed gas of $C_4F_8$, $CH_2F_2$ and Ar on a gas volume basis is not less than 10/512 and not more than 17/512.

9. The method according to claim 1, wherein the semiconductor device is an EPROM.

10. A method of fabricating a semiconductor device having a silicon dioxide film disposed at an upper layer of the semiconductor device, a BPSG film disposed below the silicon dioxide film, and a silicon nitride film disposed below the BPSG film but no silicon nitride film being disposed on top and side surfaces of the gate electrodes and no silicon nitride film being disposed above the gate electrodes, the BPSG film having gate electrodes therein, the method including provision of an organic film on the silicon dioxide film and formation of a contact hole between adjacent gate electrodes, the contact hole formation method comprising the steps of:

forming a mask pattern with a maximum opening of 0.20 μm in a resist mask applied on the organic film;

etching the silicon dioxide film and the organic film by a mixed gas of $CF_4$, $O_2$ and Ar at a substrate temperature of at least 40° C., and etching the BPSG film by an over-etching of the silicon dioxide film so that a W-like shape is formed in the BPSG film;

subsequently etching the BPSG film by a mixed gas of $C_4F_8$, $CH_2F_2$ and Ar without including CO gas and $O_2$ gas so that the contact hole between the adjacent gate electrodes has a forward tapered shape with a tapered angle of 85 degree; and subsequently etching the silicon nitride film by an over-etching of the BPSG film.

11. The method according to claim 10, wherein the mixed gas of $CF_4$, $O_2$ and Ar has a composition ratio of $CF_4$:$O_2$:Ar=3:1:8 on a gas volume basis.

12. The method according to claim 10, wherein a value obtained from a formula of (CF4 gas content+O2 gas content)/(Ar gas content) of the mixed gas of $CF_4$, $O_2$ and Ar on a gas volume basis is in a range of from 6/6 to 2/10.

13. The method according to claim 10, wherein a value obtained from a formula of (CF4 gas content)/(O2 gas content) of the mixed gas of $CF_4$, $O_2$ and Ar on a gas volume basis is in a range of from 3.5/0.5 to 1/3.

14. The method according to claim 10, wherein the substrate temperature during the etching of the silicon dioxide film is in a range from 40° C. to 80° C.

15. The method according to claim 10, wherein the mixed gas of $C_4F_8$, $CH_2F_2$ and Ar has a gas composition ratio of $C_4F_8$:$CH_2F_2$:Ar=7:4:500 on a gas volume basis.

16. The method according to claim 10, wherein a value obtained from a formula of (Ar gas flow rate)/(total gas flow rate)×100 of the mixed gas of $C_4F_8$, $CH_2F_2$ and Ar on a gas volume basis is in a range of from 96.7% to 98.0%.

17. The method according to claim 10, wherein a value obtained from a formula of ($C_4F_8$ gas content)/($CH_2F_2$ gas content) of the mixed gas of $C_4F_8$, $CH_2F_2$ and Ar on a gas volume basis is greater than 0 and not more than 1, and that a value obtained from a formula of ($C_4F_8$ gas content+$CH_2F_2$ gas content)/(total gas flow rate) of the mixed gas of $C_4F_8$, $CH_2F_2$ and Ar on a gas volume basis is not less than 10/512 and not more than 17/512.

18. The method according to claim 10, wherein the semiconductor device is an EPROM.

19. The method according to claim 10, wherein the organic film is a bottom antireflective coating (BARC) film.

20. A method of fabricating a semiconductor device having a silicon dioxide film disposed at an upper layer of the semiconductor device, a BPSG film disposed below the silicon dioxide film, and a silicon nitride film disposed below the BPSG film but no silicon nitride film being disposed on top and side surfaces of the gate electrodes and no silicon nitride film being disposed above the gate electrodes, the BPSG film having gate electrodes therein, the method including formation of a contact hole between adjacent gate electrodes, the contact hole formation method comprising the step of etching the silicon nitride film through the contact hole by using a mixed gas of $C_4F_8$, $CH_2F_2$ and Ar as an etching gas with a gas composition ratio of ($C_4F_8$ gas content)/($CH_2F_2$ gas content) being less than 1 on a gas volume basis, wherein a resist mask has a first opening for the contact hole with a maximum opening of 0.2 μm and a second opening for an alignment mark of photolithography formed on an upper layer or for measurement of the alignment with a minimum opening of 0.25 μm so that etching through the second opening is stopped at the silicon nitride film when the contact hole is opened for connection.

* * * * *